(12) United States Patent
Lin et al.

(10) Patent No.: US 7,642,479 B2
(45) Date of Patent: Jan. 5, 2010

(54) TOUCH PAD STRUCTURE

(75) Inventors: Jao-Ching Lin, Taipei (TW); Chung-Yi Shen, Taipei (TW); Lin-Abel Chu, Taipei (TW); Yen-Fu Liu, Taipei (TW)

(73) Assignee: Sentalic Corporation, Taipei (TW)

( * ) Notice: Subject to any disclaimer, the term of this patent is extended or adjusted under 35 U.S.C. 154(b) by 236 days.

(21) Appl. No.: 11/933,663

(22) Filed: Nov. 1, 2007

(65) Prior Publication Data

US 2009/0114518 A1    May 7, 2009

(51) Int. Cl.
*H03K 17/975* (2006.01)

(52) U.S. Cl. .......................... 200/600; 362/602; 362/84

(58) Field of Classification Search ............. 200/600, 200/310–317; 361/288, 313, 280, 303, 290; 362/545, 800, 602, 603, 84

See application file for complete search history.

(56) References Cited

U.S. PATENT DOCUMENTS

| 4,109,118 | A * | 8/1978 | Kley | 200/5 E |
| 2006/0278509 | A1* | 12/2006 | Marcus et al. | 200/310 |
| 2009/0050456 | A1* | 2/2009 | Kim et al. | 200/314 |

* cited by examiner

*Primary Examiner*—Edwin A. Leon

(57) ABSTRACT

A touch pad includes a first substrate, a second substrate and a joining layer. The joining layer joins the first substrate and the second substrate together. The first substrate provides a refection layer at a lateral side or both sides thereof with at least a light emitting component being disposed at the periphery of said reflection layer. The second substrate provides an electrical circuit with a first conductor to connect with the light emitting component. The reflection layer is provided with a size less than said first substrate and has an upper side to adhere said first substrate so as to be fixed in said joining layer. the electrical circuit is capable of determining if the touch pad is touched with an object by means of receiving a change of coupling capacity of a sensing locus and capable of controlling luminosity of said light emitting component.

16 Claims, 8 Drawing Sheets

TOUCH PAD STRUCTURE

BACKGROUND OF THE INVENTION

1. Field of the Invention

The present invention is related to a touch pad and particularly to a touch pad with simple structure and novel appearance.

2. Brief Description of the Related Art

The personal electronic information products such as lap top computers, mobile phone, digital cameras and personal digital assistants have been getting popularly used due to rapid development of information technology and communication network. The preceding electronic information products mostly provide a touch pad as an interface of input for handwriting or point-touch. The conventional touch pad shown in FIG. 1 basically includes a sheet of Mylar, a print circuit board and a joining layer for gluing the sheet of Mylar and the print circuit board. However, only the surface of the sheet of Mylar can be printed with various figures.

Referring to FIG. 2, another type conventional touch pad provides a light emitting diode LED) at both lateral sides or one lateral side of the touch pad and light of the LED is distributed evenly on a guide light board with a reflection layer, which is a reflection piece or a plurality of reflection dots forming a shape of knurling figures or refection pattern. The guide light board is provided with hardened treatment to intensify anti-wear property in addition to providing knurling figures for enhancing refraction. A joining layer is required to adhere the guide light board and the reflection layer.

As the foregoing, the touch pad is incapable of providing visual effect for the appearance thereof except various figures being printed on the insulator of the sensing layer. Further, the structure of the conventional touch pad is incapable of being simplified with the fabrication process.

SUMMARY OF THE INVENTION

In order to overcome the deficiencies of the preceding prior art, a primary object of the present invention is to provide a touch pad, which has a novel appearance with a simple structure.

Another object of the present invention is to provide a touch pad, which is capable of spending less labor hour and cost.

Accordingly, a touch pad according to the present invention includes a first substrate, a second substrate and a joining layer. The first substrate is adhered to the second substrate with the joining layer. The first substrate provides a refection layer at a facial side or both facial sides thereof with at least a light emitting component being disposed at the periphery of said reflection layer. The second substrate provides an electrical circuit with a first conductor to connect with the light emitting component. The reflection layer is provided with a size less than said first substrate and has an upper side to adhere said first substrate so as to be fixed in said joining layer. The electrical circuit is capable of determining if the touch pad is touched with an object by means of receiving a change of coupling capacity of a sensing locus and capable of controlling luminosity of said light emitting component.

Further, the touch pad according to the present invention is preferably added with color grains, fluorescent powder or luminous powder in the first substrate to enhance visual effect while being incorporated with light beam.

Further, the touch pad according to the present invention is preferably added with color grains, fluorescent powder or luminous powder at a side of the first substrate joined to the reflection layer or on the reflection layer to enhance visual effect while being incorporated with light beam.

Further, the touch pad according to the present invention is preferably provided with knurling figure or reflection arrangement thereon such that a pattern or characters are capable of being presented by means of reflections of strong and weak lights Further, the touch pad according to the present invention is preferably provided with light emitting diodes (LED).

Further, the touch pad according to the present invention is preferably provided with that a treatment of knurling on the first substrate to enhance comfortable feeling of hand.

Further, the touch pad according to the present invention is preferably provided with that hardening treatment on the first substrate to enhance anti-wear property.

Further, the touch pad according to the present invention is preferably provided with that the first substrate is made of polycarbonate plastics.

Further, the touch pad according to the present invention is preferably provided with that the first substrate is made of Mylar.

Further, the touch pad according to the present invention is preferably provided with that the first substrate is made of polyester film.

Further, the touch pad according to the present invention is preferably provided with that the first substrate is made of polycarbonate plastics and Mylar such that light penetrating the guide light board is capable of emitting via unshielded part of the first substrate due to original color of the Mylar being semi-transparent.

Further, the touch pad according to the present invention is preferably provided with that the first substrate being printed with figures on the surface thereof and in the plastics by means of technique of in-mold decoration by roller accomplishing surface decoration after injection process (IMR). For instance, the surface of the first substrate is printed with black shield except the logo and the plastic layer is printed with a semi-transparent black color such that complete black color is shown before the light beam passing through the first substrate and the logo is shown after the light beam passing through the first substrate.

Further, the touch pad according to the present invention is preferably provided with that the first substrate is made of glass.

Further, the touch pad according to the present invention is preferably provided with that the first conductor has an X-axis sensing locus and a Y-axis sensing locus or a single-axis (for scrolling) and a press key (point).

Further, the touch pad according to the present invention is preferably provided with that the electrical circuit of the second substrate is integrated with a processor.

Further, the touch pad according to the present invention is preferably provided with that the electrical circuit of the second substrate is connected to a processor.

In summary, the present invention provides a touch pad designed with a novel appearance and simple structure. A guide light board in association with LEDs in different colors and auxiliary light diffusion components is employed to allow colors to distribute all surfaces evenly. In addition, the surface of the guide light board is treated with knurling figures to make comfortable feeling of hand such that it is able to save labor hours for gluing the surface insulator. If necessary, the surface of the guide light board can be treated with hardening to enhance wear resistant capability.

Besides, the present invention proposes a new fabrication method of the touch pad with which the process of gluing the guide light board to the reflection layer can be waived such that less labor hours and cost are needed and perfection rate increases for promoting effect of sensing of the touch pad.

Further, the guide light board can be added with color grains, which are capable of mixing with various light beams to form additional visual effect in addition to the colors of the LEDs. Alternatively, fluorescent powder or luminous powder can be added to the lower side of the guide light board or the surface of the reflection layer to produce various patterns and especially when the light beam emits, the patterns become outstanding with an effect of night light. Hence, the present invention can overcome dull image of the traditional touch pad.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
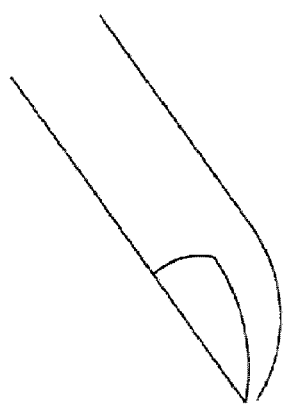
FIG. 1 is a schematic diagram of the conventional touch pad.
Figure 1:
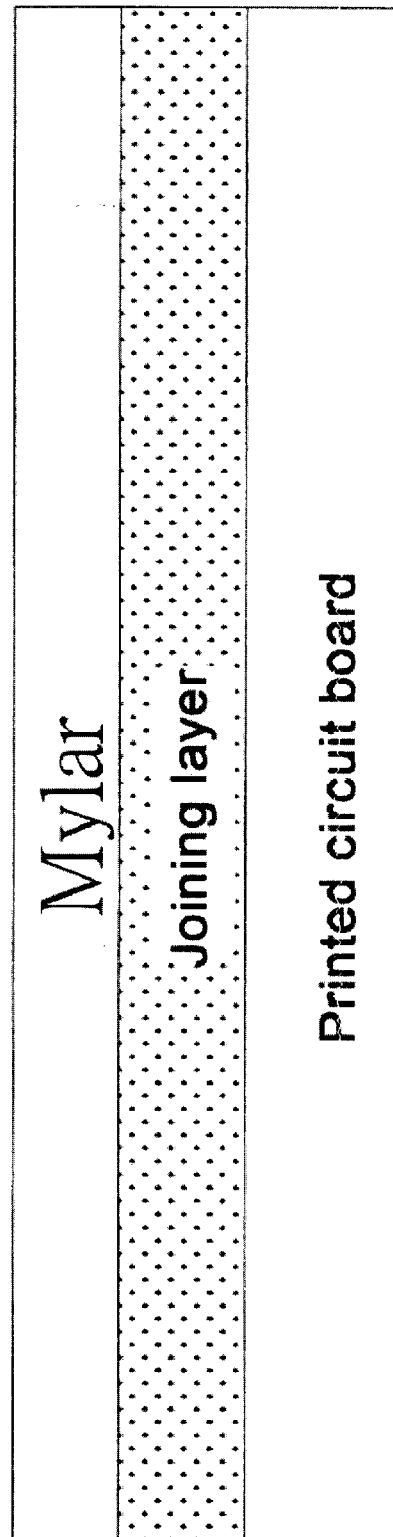
Figure 2:
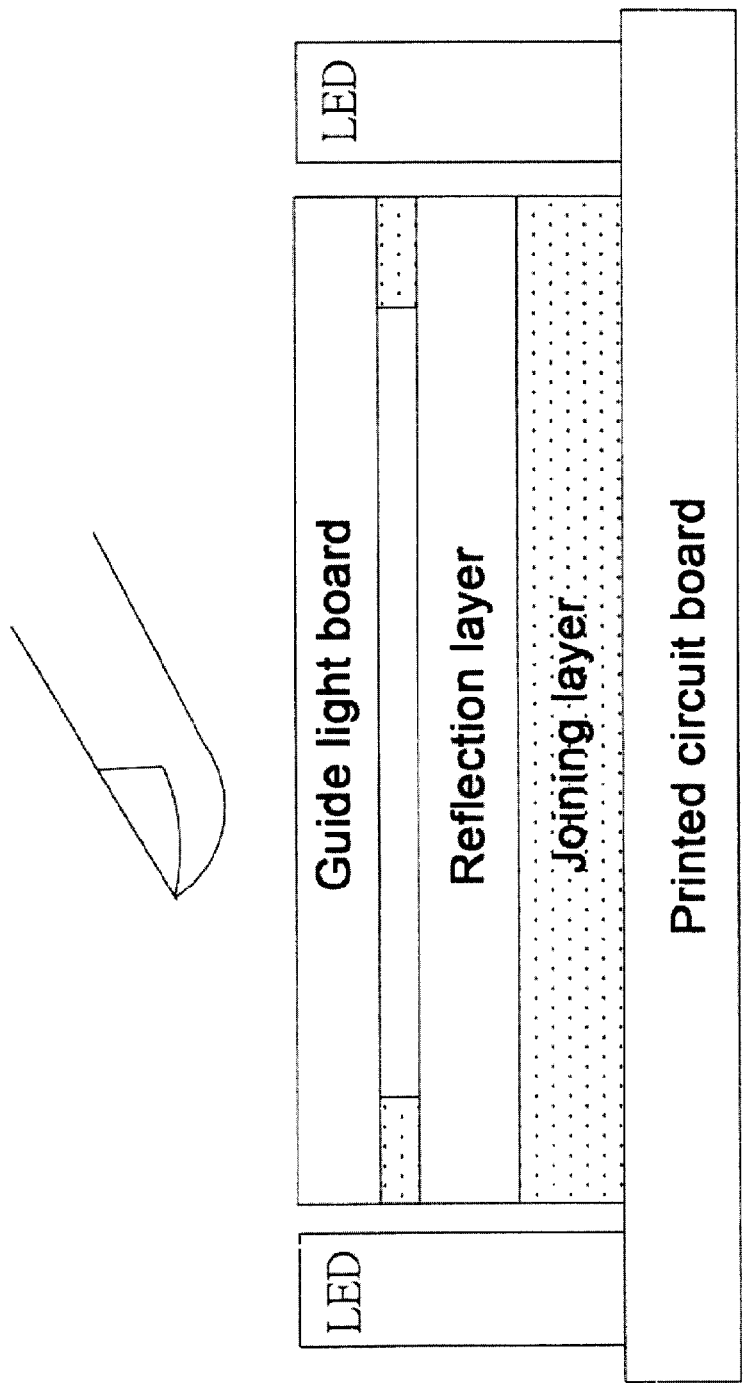
FIG. 2 is a schematic diagram of another conventional touch pad.
Figure 3:
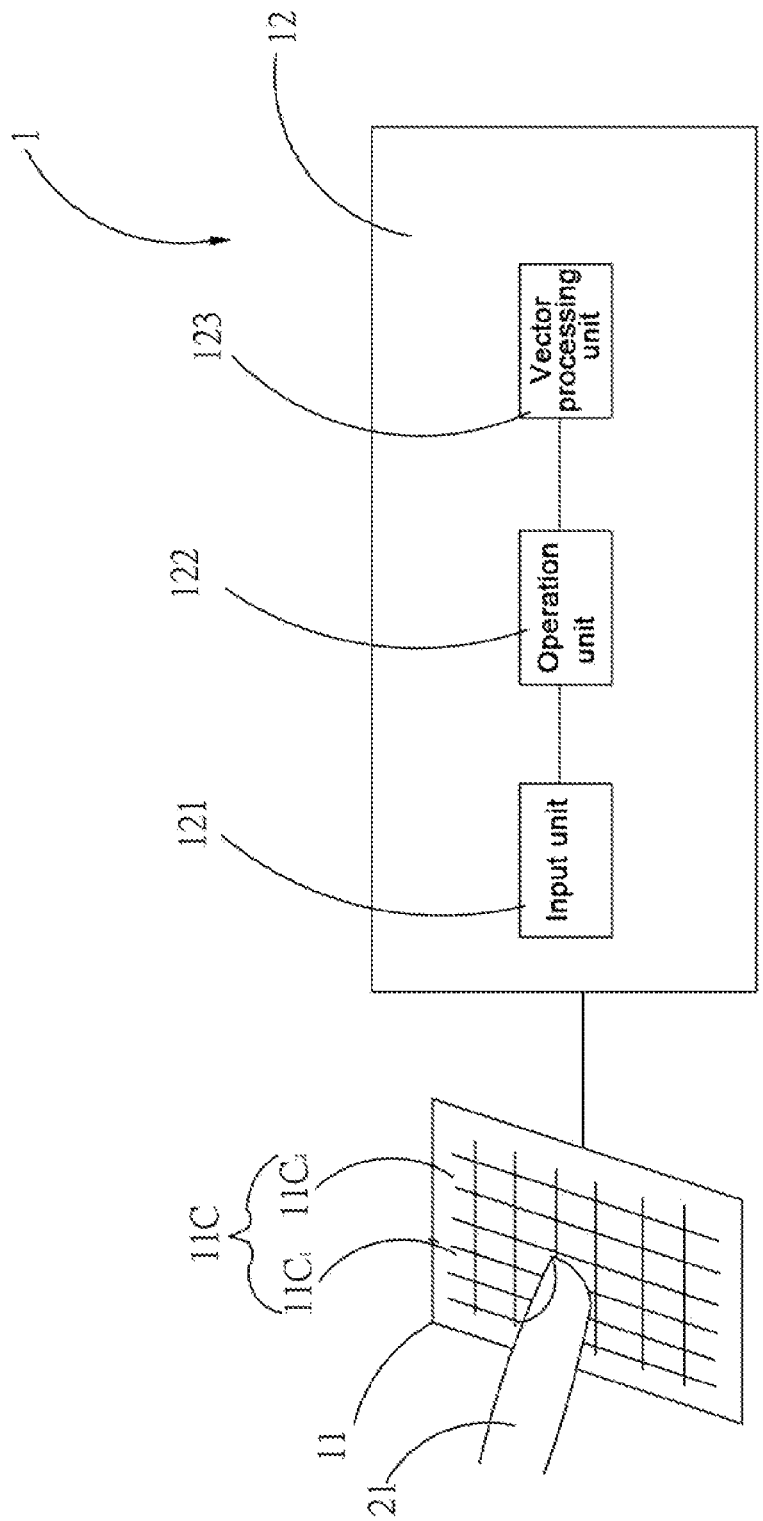
FIG. 3 is a block diagram illustrating a touch pad structure according the present invention being associated with a touch inductive system.

Referring to FIG. 3, a touch pad 11 according to the present invention is illustrated to act as a sensing unit of a touch pad system 1. The touch pad 11 is capable of sensing or detecting an object 21 such as a finger, a stylus or the like, which is close to or touches the touch pad 11, and producing a change of capacity. That is, the object 21 causes the touch pad 11 to change the capacity of at least a sensing locus provided in the touch pad 11. The touch inductive system 1 further includes a processor 12, which connects with the touch pad 11, to determine, for instance, if the object contacts the touch pad 11 and/or where is the object 21 on the touch pad 11.

The processor 12 further includes an input unit 121, which accesses information related to the change of the capacity, an operation unit 122, which connects with the input unit 121 to digitalize the information related to the change of the capacity, and a vector processing unit 123, which is connected to the operation unit 122 to treat the digitalized information. Thus, position information of the object 21 on the touch pad 11 can be obtained for being associated with other devices or systems related to the touch pad 11 such as a computer, a cell phone, a personal digital assistant (PAD) and/or screens of the preceding devices as, for example, an input/output apparatus of the devices or systems. The input unit 121, the operation unit 122 and the vector processing unit 123 provide a function of noise isolation for the noise induced by the touch pad 11 being capable of attenuated effectively.

Figure 4:
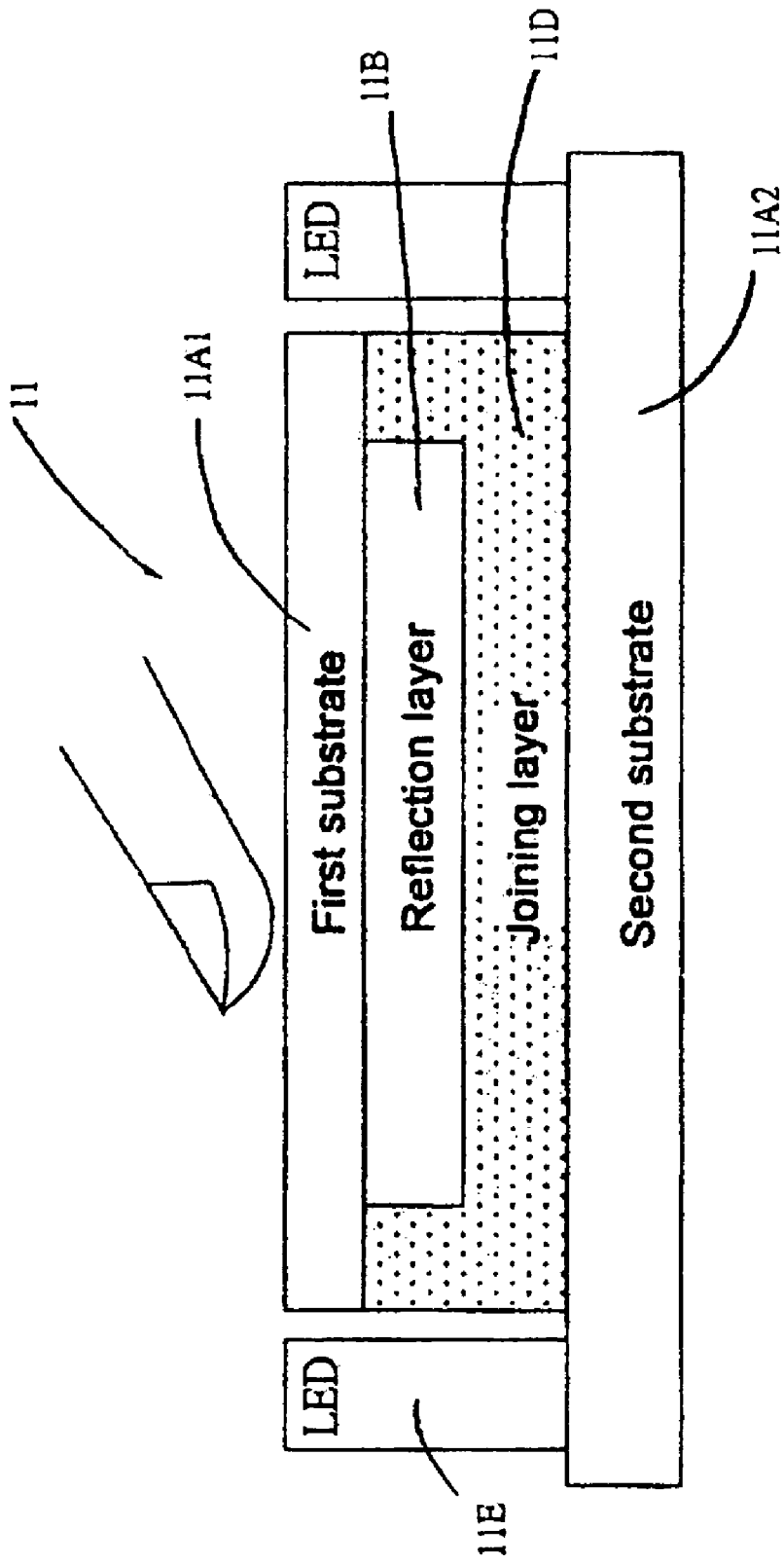
FIG. 4 is a schematic diagram of the first embodiment of a touch pad according to the present invention.

Referring to FIG. 4, a first substrate 11A1 is provided to act as a guide light plate and a reflection layer 11B is disposed next to a lateral side of the first substrate 11A1. A second substrate 11A2 is provided to act as a circuit board on which an electrical circuit is arranged and/or a first conductor 11C is disposed. The first conductor 11C has an X-axis sensing locus 11C and/or a Y-axis sensing locus as shown in FIG. 3. A joining layer 11D is disposed between and adhered to the first substrate 11A1 and the second substrate 11A2. A lateral side of the reflection layer 11B is adhered to the first substrate 11A1 and another lateral side of the reflection layer 11B is adhered to the joining layer 11D. The process of the reflection layer 11B being adhered to the first substrate 11A1 and the joining layer 11D is much simpler than the prior art such that the fabrication cost is reduced and it is capable of avoiding air entering the touch pad via clearance between the first substrate and the reflection layer due to factors of weather and temperature.

Besides, at least a light emitting component 11E is provided at the peripheral of the reflection layer 11B and is connected to the electrical circuit of the second substrate 11A2 or the processor 12 such that the first substrate 11A1 is pressed by the user to urge the first substrate 11A1 and/or the joining layer 11D to contact the first conductor 11C (the X-axis sensing locus 11C1 and/or the Y-axis sensing locus 11C2) to produce the capacity change and the electrical circuit of the second substrate 11A2 or the processor 12 can receive the capacity change to control luminosity of the light emitting component 11E. Meanwhile, the light emitting component 11E can be controlled the luminosity thereof by way of different contact positions such that the light of the light emitting component is reflected and/or refracted with the reflection layer 11B and the first substrate 11A1. The light emitting component 11E can be a light emitting diode and the light source includes a light source in various colors such that the light reaches the outer surface of the touch pad via the reflection and/or refraction to show a novel appearance. In addition, the electrical circuit on the second substrate 11A2 can be integrated with or separated from the processor 12.

The first substrate 11A1 and the second substrate 11A2 can be made of light-penetrable material such as polyester film, glass, polycarbonate plastics or Mylar, It is noted that the second substrate 11A2 can be made of light-resistant material. The adhesive glue is light-penetrable such as 3M #3 8142 or 467 and the light-penetrable conductor can be such as Indium-Tin oxide (ITO), transparent conductive plastics, silver, gold or aluminum alloy.

Figure 5:
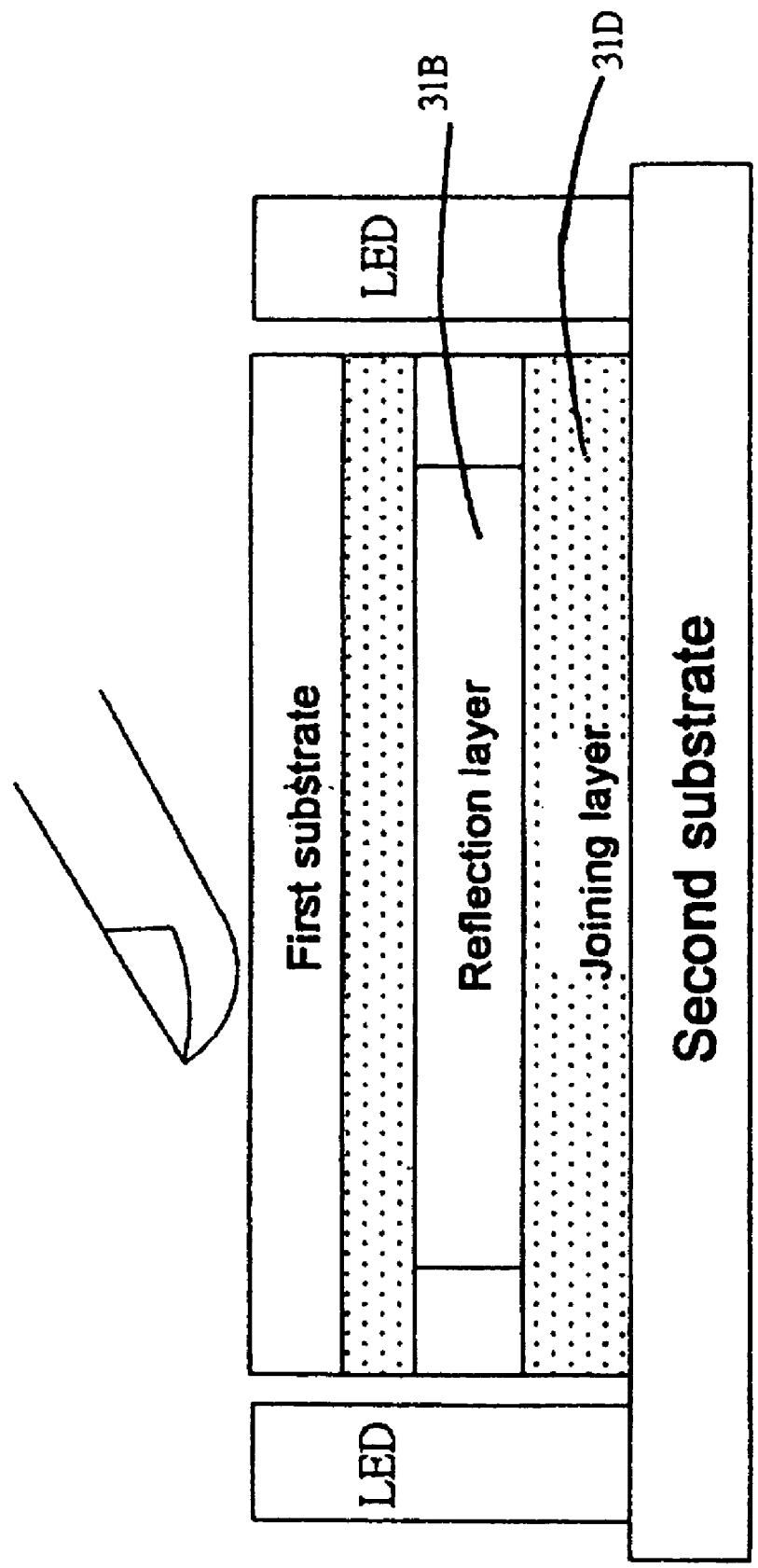
FIG. 5 is a schematic diagram of the second embodiment of a touch pad according to the present invention.

Referring to FIG. 5, another embodiment of the touch pad according to the present invention is illustrated. The difference of the second embodiment from the first embodiment is in that the upper and lower sides of the reflection layer 31B are sandwiched with a joining layer 31D respectively and the right and left sides thereof are free from the joining layers 31D such that air bubbles can be removed easily.

Figure 6:
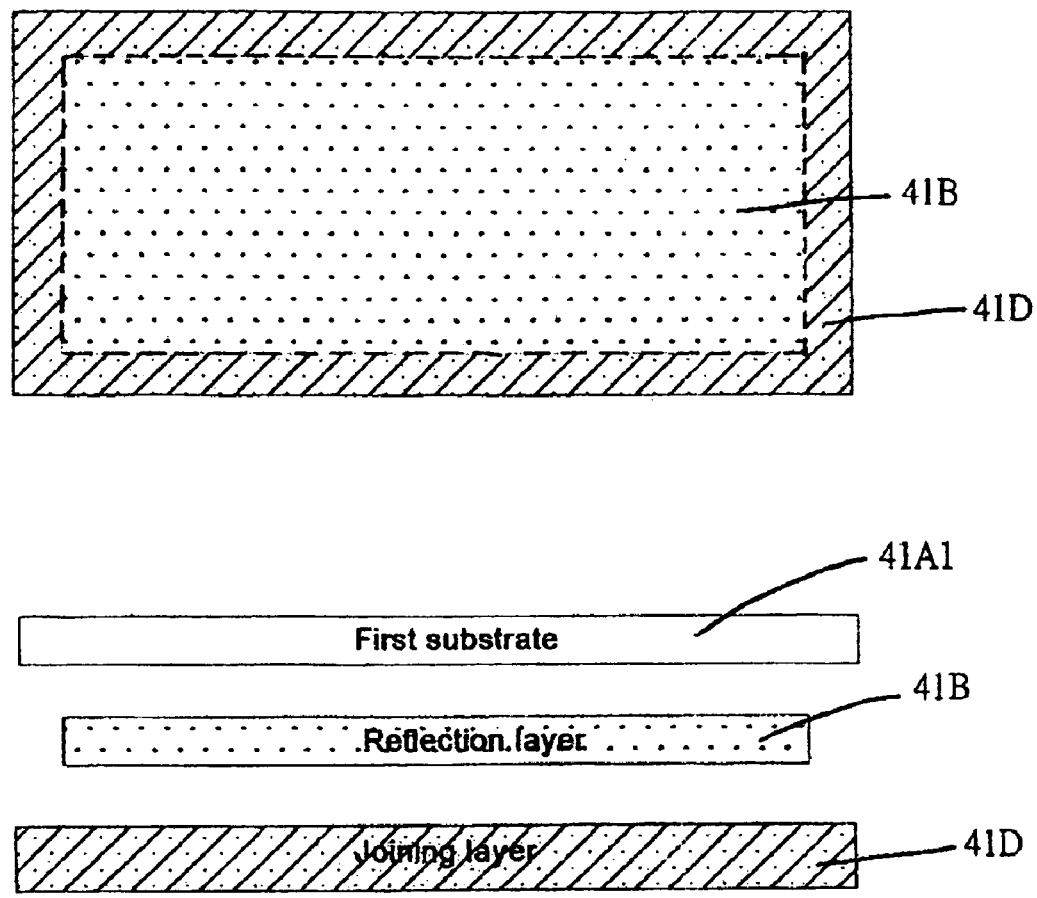
FIG. 6 is a schematic diagram of the third embodiment of a touch pad according to the present invention.

Referring to FIGS. 6A and 6B, four lateral sides of the reflection layer 41B are less than those of the first substrate 41A1 and the joining layer 41D to keep the air bubbles off the reflection layer.

Figure 7:
FIG. 7 is a schematic diagram illustrating an application of a touch pad according to the present invention.

Referring to FIG. 7, an implementation of the touch pad according to the present invention is illustrated. An illuminated logo, trademark or name of a company or an icon such as mail figure, file manager, media player or the like can be presented properly.

Figure 8:
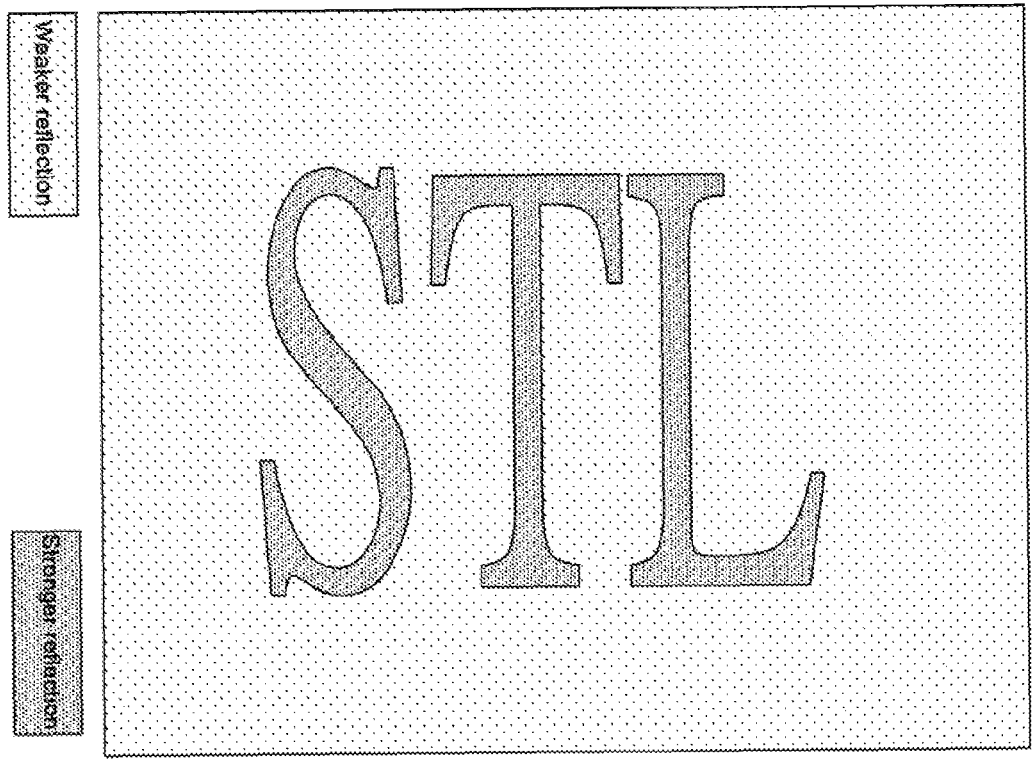
FIG. 8 is a schematic diagram illustrating another application of a touch pad according to the present invention.

Referring to FIG. 8, another implementation of the touch pad according to the present invention is illustrated. A pattern or a character is formed with reflection arrangement by means of strong or weak reflection light.

While the invention has been described with referencing to preferred embodiments thereof, it is to be understood that modifications or variations may be easily made without departing from the spirit of this invention, which is defined by the appended claims.

What is claimed is:

1. A touch pad comprising:
a first substrate providing a refection layer at a lateral side with at least a light emitting component being disposed at the periphery of said reflection layer;
a second substrate providing an electrical circuit with a first conductor to connect with said light emitting component such that said electrical circuit is capable of determining if said touch pad is touched with an object by means of receiving a change of coupling capacity of a sensing locus and capable of controlling luminosity of said light emitting component;
a joining layer joining said first substrate and said second substrate together;
wherein, said reflection layer is provided with a size less than said first substrate and has an upper side to adhere said first substrate so as to be fixed in said joining layer.

2. The touch pad as defined in claim 1, wherein said first substrate is capable of being added with color grains, fluorescent powder or luminous powder therein in association with light beam to enhance visual effect.

3. The touch pad as defined in claim 1, wherein said first substrate is capable of being added with color grains, fluorescent powder or luminous powder at the side provided with said reflection layer or said reflection layer is capable of being added with color grains, fluorescent powder or luminous powder thereon in association with light beam to enhance visual effect.

4. The touch pad as defined in claim 1, wherein knurling figure or reflection arrangement is provided on said touch pad such that a pattern or characters are presented by means of reflections of strong and weak lights.

5. The touch pad as defined in claim 1, wherein said light emitting component is a light emitting diode.

6. The touch pad as defined in claim 1, wherein a treatment of knurling is provided on said first substrate to enhance comfortable feeling of hand.

7. The touch pad as defined in claim 1, wherein a hardening treatment is provided on said first substrate to enhance anti-wear property.

8. The touch pad as defined in claim 1, wherein said first substrate is made of polycarbonate plastics.

9. The touch pad as defined in claim 1, wherein said first substrate is made of Mylar.

10. The touch pad as defined in claim 1, wherein said first substrate is made of polyester film.

11. The touch pad as defined in claim 1, wherein said first substrate is made of polycarbonate plastics and Mylar.

12. The touch pad as defined in claim 1, wherein said first substrate is printed with figures on the surface thereof and in the plastics by means of technique of in-mold decoration by roller accomplishing surface decoration after injection process (IMR).

13. The touch pad as defined in claim 1, wherein said first substrate is made of glass.

14. The touch pad as defined in claim 1, wherein the first conductor has an X-axis sensing locus 11C and a Y-axis sensing locus, a single-axis (for scrolling) and a press key (point).

15. The touch pad as defined in claim 1, wherein said electrical circuit is integrated with a processor.

16. The touch pad as defined in claim 1, wherein said electrical circuit is connected to a processor.

* * * * *